United States Patent
Slater, Jr. et al.

(10) Patent No.: US 6,794,684 B2
(45) Date of Patent: Sep. 21, 2004

(54) REFLECTIVE OHMIC CONTACTS FOR SILICON CARBIDE INCLUDING A LAYER CONSISTING ESSENTIALLY OF NICKEL, METHODS OF FABRICATING SAME, AND LIGHT EMITTING DEVICES INCLUDING THE SAME

(75) Inventors: David B. Slater, Jr., Raleigh, NC (US); Helmut Hagleitner, Zebulon, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 10/368,063

(22) Filed: Feb. 14, 2003

(65) Prior Publication Data

US 2003/0168663 A1 Sep. 11, 2003

Related U.S. Application Data

(63) Continuation-in-part of application No. 10/057,821, filed on Jan. 25, 2002.
(60) Provisional application No. 60/411,980, filed on Sep. 19, 2002, provisional application No. 60/307,235, filed on Jul. 23, 2001, and provisional application No. 60/265,707, filed on Feb. 1, 2001.

(51) Int. Cl.[7] ............... H01L 31/0312; H01L 29/22; H01L 31/0256; H01L 31/0296; H01L 33/00

(52) U.S. Cl. .................. 257/77; 257/91; 257/99; 257/103; 438/46

(58) Field of Search .................. 257/91, 99, 103, 257/77; 438/46; 250/370.01, 370.07; 338/22; 428/74

(56) References Cited

U.S. PATENT DOCUMENTS

| 4,918,497 A | 4/1990 | Edmond | 357/17 |
|---|---|---|---|
| 4,966,862 A | 10/1990 | Edmond | 437/100 |
| 5,006,908 A | 4/1991 | Matsuoka et al. | 357/17 |
| 5,027,168 A | 6/1991 | Edmond | 357/17 |
| 5,087,949 A | 2/1992 | Haitz | 357/17 |

(List continued on next page.)

FOREIGN PATENT DOCUMENTS

| EP | 0 051 172 | 5/1982 |
|---|---|---|
| EP | 0 961 328 A2 | 12/1999 |
| EP | 1 168 460 A2 | 1/2002 |
| GB | 2 346 480 A | 8/2000 |

(List continued on next page.)

OTHER PUBLICATIONS

International Search Report, PCT/US02/02849, Aug. 26, 2002.
U.S. application Ser. No. 10/003,331, filed Oct. 31, 2001, *Low Temperature Formation of Backside Ohmic Contacts for Vertical Devices.*
U.S. application Ser. No. 60/294,445, filed May 30, 2001, *Multi-Quantum Well Light Emitting Diode Structure.*
U.S. application Ser. No. 60/294,378, filed May 30, 2001, *Light Emitting Diode Structure With Multi-Quantum Well and Superlattice Structure.*

(List continued on next page.)

*Primary Examiner*—William M. Brewster
(74) *Attorney, Agent, or Firm*—Myers Bigel Sibley & Sajovec (57) ABSTRACT

Reflective ohmic contacts for n-type silicon carbide include a layer consisting essentially of nickel on the silicon carbide. The layer consisting essentially of nickel is configured to provide an ohmic contact to the silicon carbide, and to allow transmission therethrough of optical radiation that emerges from the silicon carbide. A reflector layer is on the layer consisting essentially of nickel, opposite the silicon carbide. A barrier layer is on the reflector layer opposite the layer consisting essentially of nickel, and a bonding layer is on the barrier layer opposite the reflector layer. It has been found that the layer consisting essentially of nickel and the reflector layer thereon can provide a reflective ohmic contact for silicon carbide that can have low ohmic losses and/or high reflectivity.

46 Claims, 3 Drawing Sheets

U.S. PATENT DOCUMENTS

| | | |
|---|---|---|
| 5,187,547 A | 2/1993 | Niina et al. .................... 257/77 |
| 5,210,051 A | 5/1993 | Carter, Jr. .................. 437/107 |
| 5,237,182 A | 8/1993 | Kitagawa et al. ............. 257/15 |
| 5,247,533 A | 9/1993 | Okazaki et al. ............... 372/45 |
| 5,338,944 A * | 8/1994 | Edmond et al. .............. 257/76 |
| 5,338,994 A | 8/1994 | Lezan et al. .................. 307/86 |
| 5,369,289 A | 11/1994 | Tamaki et al. ................ 257/99 |
| 5,393,993 A | 2/1995 | Edmond et al. .............. 257/77 |
| 5,416,342 A | 5/1995 | Edmond et al. .............. 257/76 |
| 5,523,589 A | 6/1996 | Edmond et al. .............. 257/77 |
| 5,585,648 A | 12/1996 | Tischler ....................... 257/77 |
| 5,604,135 A | 2/1997 | Edmond et al. .............. 437/22 |
| 5,631,190 A | 5/1997 | Negley ......................... 438/33 |
| 5,718,760 A | 2/1998 | Carter et al. .................. 117/84 |
| 5,739,554 A | 4/1998 | Edmond et al. ............ 257/103 |
| 5,760,479 A | 6/1998 | Yang et al. .................. 257/778 |
| 5,767,581 A | 6/1998 | Nakamura et al. .......... 257/749 |
| 5,777,350 A | 7/1998 | Nakamura et al. ........... 257/96 |
| 5,779,924 A | 7/1998 | Krames et al. ............... 216/24 |
| 5,912,477 A | 6/1999 | Negley ......................... 257/95 |
| 5,917,202 A | 6/1999 | Haitz et al. ................... 257/98 |
| 5,952,681 A | 9/1999 | Chen ............................ 257/89 |
| 6,015,719 A | 1/2000 | Kish, Jr. et al. .............. 438/29 |
| 6,046,465 A | 4/2000 | Wang et al. ................... 257/98 |
| 6,091,085 A | 7/2000 | Lester .......................... 257/98 |
| 6,097,041 A | 8/2000 | Lin et al. ....................... 257/98 |
| 6,118,259 A | 9/2000 | Bucks et al. ................ 323/312 |
| 6,120,600 A | 9/2000 | Edmond et al. .............. 117/89 |
| 6,121,636 A | 9/2000 | Morita et al. ................. 257/99 |
| 6,121,637 A | 9/2000 | Isokawa et al. ............... 257/99 |
| 6,133,589 A | 10/2000 | Krames et al. ............. 257/103 |
| 6,139,166 A | 10/2000 | Marshall et al. ............ 362/231 |
| 6,147,458 A | 11/2000 | Bucks et al. ................ 325/225 |
| 6,169,294 B1 | 1/2001 | Biing-Jye et al. ............. 257/79 |
| 6,177,688 B1 | 1/2001 | Linthicum et al. ............ 257/77 |
| 6,187,606 B1 | 2/2001 | Edmond et al. .............. 438/46 |
| 6,194,742 B1 | 2/2001 | Kern et al. .................... 257/94 |
| 6,201,264 B1 | 3/2001 | Khare et al. ................... 257/97 |
| 6,204,523 B1 | 3/2001 | Carey et al. ................... 257/98 |
| 6,222,207 B1 * | 4/2001 | Carter-Coman et al. ...... 257/98 |
| 6,229,160 B1 | 5/2001 | Krames et al. ................ 257/94 |
| 6,455,878 B1 | 9/2002 | Bhat et al. ..................... 257/99 |
| 2003/0006418 A1 | 1/2003 | Emerson et al. .............. 257/79 |
| 2003/0010975 A1 * | 1/2003 | Gibb et al. .................... 257/40 |
| 2003/0025212 A1 | 2/2003 | Bhat et al. ................... 257/781 |

FOREIGN PATENT DOCUMENTS

| | | |
|---|---|---|
| JP | 56-131977 | 10/1981 |
| JP | 61110476 | 5/1986 |
| JP | 1-225377 | 9/1989 |
| JP | 06-232510 | 8/1994 |
| JP | 07-235729 | 9/1995 |
| JP | 08-321660 | 12/1996 |
| JP | 9-82587 | 3/1997 |
| JP | 09-223846 | 8/1997 |
| JP | 10-163530 | 6/1998 |
| JP | 10-233549 | 9/1998 |
| JP | 10-256604 | 9/1998 |
| JP | 11-150302 A | 6/1999 |
| JP | 11-191641 | 7/1999 |
| JP | 11-220168 A | 8/1999 |
| JP | 2000-77713 A | 3/2000 |
| JP | 2000-195827 | 7/2000 |
| WO | WO 00/33365 A1 | 6/2000 |
| WO | WO 01/47039 A1 | 6/2001 |

OTHER PUBLICATIONS

U.S. application Ser. No. 60/294,308, filed May 30, 2001, *Light Emitting Diode Structure With Superlattice Structure*.

U.S. application Ser. No. 09/787,189, filed Mar. 15, 2001, *Low Temperature Formation of Backside Ohmic Contacts for Vertical Devices*.

OSRAM Enhances Brightness of Blue InGaN LEDs, Compound Semiconductor, vol. 7, No. 1, Feb. 2001, p. 7.

Craford, *Outlook for AlInGaP Technology*, Presentation, Strategies in Light 2000.

Krames et al., *High–Power Truncated–Inverted–Pyramid $(Al_xGa_{1-x})_{0.5}In_{0.5}P/GaP$ Light–Emitting Diodes Exhibiting>50% External Quantum Efficiency*, Applied Physics Letters, vol. 75, No. 16, Oct. 18, 1999, pp. 2365–2367.

Lambrecht et al., *Band Structure Interpretation of the Optical Transitions Between Low–Lying Conduction Bands in n–Type Doped SiC Polytypes*, Materials Science Forum, vols. 264–268, 1998, pp. 271–274.

Mensz et al., $In_xGa_{1-x}N/Al_yGa_{1-y}N$ *Violet Light Emitting Diodes With Reflective p–Contacts for High Single Sided Light Extraction*, Electronics Letters, vol. 33, No. 24, Nov. 20, 1997, pp. 2066–2068.

Craford, *Overview of Device Issues in High–Brightness Light–Emitting Diodes*, Chapter 2, High Brightness Light Emitting Diodes: Semiconductors and Semimetals, vol. 48, Stringfellow et al. ed., Academic Press, 1997, pp. 47–63.

Honma et al., *Evaluation of Barrier Metals of Solder Bumps for Flip–Chip Interconnection*, Electronic Manufacturing Technology Symposium, 1995, Proceedings of 1995 Japan International, 18th IEEE/CPMT, Dec. 4, 1995, pp. 113–116.

Lee et al., *Bonding of InP Laser Diodes by Au–Sn Solder and Tungsten–Based Barrier Metallization Schemes*, Semiconductor Science and Technology, vol. 9, No. 4, Apr. 1994, pp. 379–386.

Yoo et al., *Bulk Crystal Growth of 6H–SiC on Polytype–Controlled Substrates Through Vapor Phase and Characterization*, Journal of Crystal Growth, vol. 115, vol. 1991, pp. 733–739.

Biederman, *The Optical Absorption Bands and Their Anisotropy in the Various Modifications of SiC*, Solid State Communications, vol. 3, 1965, pp. 343–346.

U.S. application Ser. No. 09/154,363, *Vertical Geometry InGaN LED*.

International Search Report, PCT/US02/23266, May 22, 2003.

* cited by examiner

REFLECTIVE OHMIC CONTACTS FOR SILICON CARBIDE INCLUDING A LAYER CONSISTING ESSENTIALLY OF NICKEL, METHODS OF FABRICATING SAME, AND LIGHT EMITTING DEVICES INCLUDING THE SAME

CROSS-REFERENCE TO RELATED APPLICATIONS

This application is a continuation-in-part ("CIP") of application Ser. No. 10/057,821, filed Jan. 25, 2002, entitled Light Emitting Diodes Including Substrate Modifications for Light Extraction and Manufacturing Methods Therefor, which claims the benefit of Provisional Application Ser. No. 60/265,707, filed Feb. 1, 2001 entitled Light Emitting Diode With Optically Transparent Silicon Carbide Substrate, and Provisional Application Ser. No. 60/307,235, filed Jul. 23, 2001, entitled Light Emitting Diodes Including Modifications for Light Extraction and Manufacturing Methods Therefor. This application also claims the benefit of Provisional Application Ser. No. 60/411,980, filed Sep. 19, 2002, entitled Phosphor-Coated Light Emitting Diodes Including Tapered Sidewalls, and Fabrication Methods Therefor. The disclosures of all of these applications are hereby incorporated herein by reference in their entirety as if set forth fully herein.

FIELD OF THE INVENTION

This invention relates to silicon carbide-based microelectronic devices and fabrication methods therefor, and more particularly to silicon carbide-based light emitting devices such as Light Emitting Diodes (LEDs) and laser diodes and fabrication methods therefor.

BACKGROUND OF THE INVENTION

Light emitting diodes are widely used in consumer and commercial applications. As is well known to those having skill in the art, a light emitting diode generally includes a diode region on a microelectronic substrate. The microelectronic substrate may comprise, for example, silicon, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

In fabricating light emitting devices, such as LEDs and/or laser diodes, using silicon carbide, it may be desirable to provide a reflective ohmic contact to the silicon carbide, and more specifically to n-type silicon carbide. These reflective ohmic contacts should be simple to fabricate using conventional microelectronic fabrication techniques, and should provide low ohmic losses and/or high reflectivity. These contacts also should be amenable to wire bonding and/or submount bonding thereto.

SUMMARY OF THE INVENTION

Reflective ohmic contacts for silicon carbide and, in some embodiments, for n-type silicon carbide, according to some embodiments of the present invention, include a layer consisting essentially of nickel on the silicon carbide. The layer consisting essentially of nickel is configured to provide an ohmic contact to the silicon carbide, and to allow transmission therethrough of optical radiation that emerges from the silicon carbide. It will be understood that, as used herein, the layer consisting essentially of nickel contains substantially only elemental nickel, and does not contain substantial amounts of nickel alloys, nickel oxides and/or other nickel compounds, but may contain insubstantial amounts of impurities ordinarily associated with nickel, including insubstantial amounts of the above-described alloys or compounds and may also contain insubstantial or substantial amounts of materials that do not materially affect the basic and novel characteristics of the elemental nickel as an ohmic contact to the silicon carbide that also allow transmission therethrough of optical radiation that emerges from the silicon carbide. Reflective ohmic contacts according to embodiments of the present invention also include a reflector layer on the layer consisting essentially of nickel, opposite the silicon carbide, a barrier layer on the reflector layer opposite the layer consisting essentially of nickel, and a bonding layer on the barrier layer opposite the reflector layer. It has been found, according to some embodiments of the present invention, that the layer consisting essentially of nickel and the reflector layer thereon can provide a reflective ohmic contact for silicon carbide that can have low ohmic losses and/or high reflectivity.

In other embodiments of the present invention, the layer consisting essentially of nickel is sufficiently thin to allow transmission therethrough of substantially all optical radiation that emerges from the silicon carbide. In yet other embodiments, the reflector layer is sufficiently thick to reflect substantially all optical radiation that emerges from the layer consisting essentially of nickel. Moreover, in other embodiments of the present invention, the silicon carbide includes a surface and a layer consisting essentially of nickel covers the surface. By covering the surface, adhesion of the nickel to the silicon carbide may be enhanced, and reflectivity of substantially all of the optical radiation that emerges from the silicon carbide may be provided. In still other embodiments, the layer consisting essentially of nickel covers only a portion of the surface and/or may be patterned, for example to form a grid.

Other embodiments of the present invention provide the reflective ohmic contact on the first face of a silicon carbide substrate and a light emitting region on a second face of the silicon carbide substrate, to provide a light emitting element such as an LED or a laser. Moreover, in other embodiments, a mounting assembly is provided on the bonding layer opposite the barrier layer. In yet other embodiments, a wire bond is provided to the bonding layer. Other external elements also may be bonded to the bonding layer.

In some embodiments of the present invention, the layer consisting essentially of nickel is a layer consisting of unannealed nickel. Moreover, in some embodiments, the layer consisting essentially of nickel is between about 15 Å and about 100 Å thick. In other embodiments, the layer consisting essentially of nickel is between about 15 Å and about 25 Å thick. In still other embodiments, the layer consisting essentially of nickel is about 15 Å thick and, in yet other embodiments, the layer consisting essentially of nickel is about 25 Å thick.

In some embodiments of the invention, the reflector layer comprises silver and/or aluminum. In some embodiments of the present invention, this layer is between about 700 Å and about 2 μm thick. In other embodiments, this layer is at least about 700 Å thick. In still other embodiments, this layer is about 1000 Å thick.

In some embodiments of the present invention, the barrier layer comprises platinum. In some embodiments, this layer is between about 250 Å and about 1 µm thick. In other embodiments, this layer is at least about 250 Å thick. In other embodiments, this layer is about 500 Å thick and, in still other embodiments, this layer is about 1000 Å thick.

In some embodiments of the invention, the bonding layer comprises gold. In some embodiments, this layer is between about 250 Å and about 1 µm thick. In other embodiments, this layer is at least about 250 Å thick. In other embodiments, this layer is about 500 Å thick and, in still other embodiments, this layer is about 1 µm thick.

Light emitting elements such as light emitting diodes may be fabricated, according to some embodiments of the present invention, by depositing a first layer consisting essentially of nickel on a first face of a silicon carbide substrate that includes a diode region on a second face thereof. A second layer comprising silver and/or aluminum is deposited on the first layer opposite the first face. A third layer comprising platinum is deposited on the second layer opposite the first layer. A fourth layer comprising gold is deposited on the third layer opposite the second layer. The fourth layer is bonded to an external element such as a mounting assembly, submount and/or wire. Annealing is not performed during the deposition of the first layer, between the deposition of the first layer and the deposition of the second layer, between the deposition of the second layer and the deposition of the third layer, between the deposition of the third layer and the deposition of the fourth layer, or between the deposition of the fourth layer and the bonding of the fourth layer. In other embodiments, patterning also is not performed during the deposition of a first layer, between the deposition of a first layer and the deposition of a second layer, between the deposition of a second layer and the deposition of a third layer, between the deposition of a third layer and the deposition of a fourth layer, between the deposition of a fourth layer and the bonding the fourth layer and during the bonding the fourth layer. In yet other embodiments, patterning may be performed in at least one of these operations. Moreover, in other embodiments, all of the above-described deposition steps are performed at room temperature. Accordingly, some embodiments of the present invention may provide ease of fabrication by eliminating some patterning steps and/or not using high temperature annealing during fabrication of the contact.

DETAILED DESCRIPTION OF PREFERRED EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on or extend directly onto the other element or intervening elements may also be present. In contrast, when an element is referred to as being "directly on" another element, there are no intervening elements present. Moreover, each embodiment described and illustrated herein includes its complementary conductivity type embodiment as well.

Embodiments of the invention now will be described, generally with reference to gallium nitride-based light emitting diodes on silicon carbide-based substrates. However, it will be understood by those having skill in the art that many embodiments of the invention may be employed with any combination of a silicon carbide substrate and/or layer and a light emitting element such as a light emitting diode or laser diode. Accordingly, combinations can include, for example, a silicon carbide diode on a silicon carbide substrate.

Figure 1:
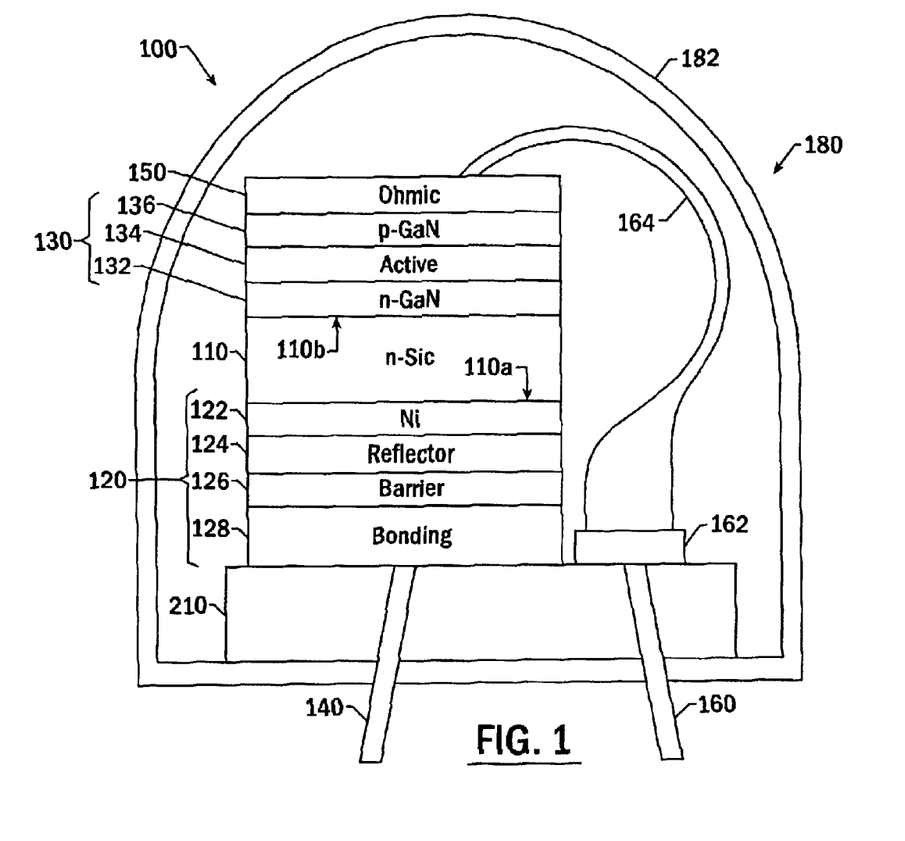
FIGS. 1–3 are cross-sectional views of LEDs including reflective ohmic contacts according to some embodiments of the present invention.

FIG. 1 is a cross-sectional view of light emitting elements such as light emitting diodes and reflective ohmic contacts according to some embodiments of the present invention. As shown in FIG. 1, these light emitting diodes 100 include a silicon carbide substrate 110, such as an n-type silicon carbide substrate, having first and second opposing faces 110a and 110b and that is transparent to optical radiation in a predetermined wavelength range, i.e., that does not absorb or reflect all the optical radiation in the predetermined wavelength range. A diode region 130 is on the second face 110b and is configured to emit light in the predetermined wavelength range into the silicon carbide substrate 110 that is transparent to optical radiation in the predetermined wavelength range, upon application of voltage across the diode region, for example across ohmic contacts 120 and 150.

Still referring to FIG. 1, in these embodiments, the diode region 130 includes an n-type layer 132, an active region 134, and a p-type layer 136. Ohmic contacts 150 and 120 are made to the p-type layer 136 and to the n-type silicon carbide substrate 110, respectively, to provide an anode 160 and a cathode 140, respectively. In some embodiments, the diode region 130, including the n-type layer 132, the active region 134, and/or the p-type layer 136, comprise gallium nitride-based semiconductor layers, including alloys thereof such as indium gallium nitride and/or aluminum indium gallium nitride. It also will be understood that a buffer layer or layers, for example comprising aluminum gallium nitride, may be provided between the n-type gallium nitride layer 132 and the silicon carbide substrate 110, for example as described in U.S. Pat. Nos. 5,393,993, 5,523,589, 6,177,688, and application Ser. No. 09/154,363 entitled Vertical Geometry InGaN Light Emitting Diode, the disclosures of which are hereby incorporated herein by reference in their entirety as if set forth fully herein.

The active region 134 may comprise a single layer of n-type, p-type or intrinsic gallium nitride-based materials, another homostructure, a single heterostructure, a double heterostructure and/or a quantum well structure, all of which are well known to those having skill in the art. Moreover, the active region 134 may comprise a light emitting layer bounded by one or more cladding layers. In some embodiments, the n-type gallium nitride layer 132 comprises silicon-doped gallium nitride, while the p-type gallium nitride layer 136 comprises magnesium-doped gallium nitride. In addition, the active region 134 may preferably include at least one indium gallium nitride quantum well.

For example, the light emitting elements such as diodes 100 may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,264, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in U.S. Provisional Patent Application Serial No. 60/294,378, entitled Light Emitting Diode Structure With Multi-Quantum Well and Superlattice Structure, U.S. Provisional Patent Application Serial No. 60/294,445, entitled Multi-Quantum Light Emitting Diode Structure and U.S. Provisional Patent Application Serial No. 60/294,308, entitled Light Emitting Diode Structure With Superlattice Structure, each filed May 30, 2001, U.S. patent application Ser. No. 10/140,796, filed May 7, 2002, (now U.S. Publication No. 2003/0006418, published Jan. 9, 2003), entitled Group III Nitride Based Light Emitting Diode Structures With A Quantum Well And Superlattice, Group III Nitride Based Quantum Well Structures And Group III Nitride Based Superlattice Structures, as well as U.S. Provisional Patent Application Serial No. 60/307,235, filed Jul. 23, 2001, entitled Light Emitting Diodes Including Substrate Modifications For Light Extraction And Manufacturing Methods Therefor and U.S. patent application Ser. No. 10/057,821, filed Jan. 25, 2002 entitled Light Emitting Diodes Including Substrate Modifications For Light Extraction And Manufacturing Methods Therefor. the disclosures of which are incorporated herein as if set forth fully. Furthermore, phosphor coated LEDs, such as those described in U.S. Provisional Application Serial No. 60/411,980, filed Sep. 19, 2002 entitled Phosphor-Coated Light Emitting Diodes Including Tapered Sidewalls, and Fabrication Methods Therefor, the disclosure of which is incorporated by reference herein as if set forth fully, may also be suitable for use in embodiments of the present invention.

In some embodiments, the ohmic contact 150 for the p-type gallium nitride layer 136 comprises platinum, nickel and/or titanium/gold. In other embodiments, a reflective ohmic contact comprising, for example, aluminum and/or silver, may be used. Other suitable materials that form ohmic contacts to p-type gallium nitride may be used for ohmic contact 150. Examples of ohmic contacts to n-type gallium nitride and p-type gallium nitride are shown, for example, in U.S. Pat. No. 5,767,581, the disclosure of which is hereby incorporated herein by reference in its entirety as if set forth fully herein.

Still referring to FIG. 1, in some embodiments, the substrate 110 comprises a silicon carbide substrate that is transparent to optical radiation in the predetermined wavelength range. These substrates may be semi-insulating (high resistivity) so that contacts according to embodiments of the invention may be used as a reflector. One technique for fabricating a silicon carbide substrate that is transparent to optical radiation in a predetermined wavelength range is described in U.S. Pat. No. 5,718,760, which is assigned to the assignee of the present invention, the disclosure of which is hereby incorporated herein in its entirety as if set forth fully herein. Silicon carbide substrate 110 may comprise the 2H, 4H, 6H, 8H, 15R and/or 3C polytypes. The 6H and/or 4H polytype may be preferred for optoelectronic applications. In other embodiments, the silicon carbide substrate 110 is a compensated, colorless silicon carbide substrate, as described in the above-cited U.S. Pat. No. 5,718,760. Gallium nitride-based epitaxial layers may be formed on the substrate, for example, as described in U.S. Pat. No. 6,177,688, which then can be processed to produce structures such as are shown in FIG. 1.

Continuing with the description of FIG. 1, according to embodiments of the present invention, reflective ohmic contacts 120 for silicon carbide, such as the first face 110*a* of the n-type silicon carbide substrate 110, are provided. As shown in FIG. 1, these ohmic contacts may include a layer 122 consisting essentially of nickel, also referred to as a first layer, on the silicon carbide, such as on the first face 110*a* of the n-type silicon carbide substrate 110. As used herein, a layer consisting essentially of nickel contains substantially only elemental nickel, and does not contain substantial amounts of nickel alloys, nickel oxides and/or other nickel compounds, but may contain insubstantial amounts of impurities ordinarily associated with nickel, including insubstantial amounts of the above-described alloys or compounds and may also contain insubstantial or substantial amounts of materials that do not materially affect the basic and novel characteristics of the elemental nickel as an ohmic contact to the silicon carbide that also allow transmission therethrough of optical radiation that emerges from the silicon carbide. In some embodiments, these insubstantial amounts are less than about 0.01%. In other embodiments, they are less than about 1%.

In some embodiments, the layer consisting essentially of nickel 122 is sufficiently thick to provide an ohmic contact to the silicon carbide substrate 110, but is sufficiently thin to allow transmission therethrough of at least some optical radiation that emerges from the first face 110*a* of the silicon carbide substrate 110. In other embodiments, the layer consisting essentially of nickel 122 is sufficiently thin to allow transmission therethrough of substantially all optical radiation that emerges from the silicon carbide substrate first face 110*a*. In some embodiments, substantially all optical radiation is more than about 50% of the optical radiation. In other embodiments, substantially all optical radiation is more than about 90% of the optical radiation. In some embodiments, the layer 122 consisting essentially of nickel is between about 15 Å and about 100 Å thick. In other embodiments, the layer 122 consisting essentially of nickel is between about 15 Å and about 25 Å thick. In still other embodiments, the layer 122 is about 25 Å thick and, in still other embodiments, this layer is about 15 Å thick.

The reflective ohmic contact 120 also includes a conductive reflector layer 124, also referred to as a second layer, on the layer 122 consisting essentially of nickel, opposite the silicon carbide substrate 110. In some embodiments, the reflector layer is sufficiently thick to reflect substantially all optical radiation that emerges from the layer 122 consisting essentially of nickel. In some embodiments, substantially all optical radiation is more than about 50% of the optical radiation. In other embodiments, substantially all optical radiation is more than about 90% of the optical radiation. In some embodiments, the reflector layer 124 comprises silver and/or aluminum. In other embodiments, the reflector layer 124 is at least about 700 Å thick. In still other embodiments, the reflector layer 124 is between about 700 Å and about 2 μm thick. In yet other embodiments, the reflector layer 124 is about 1000 Å thick.

Figure 2:
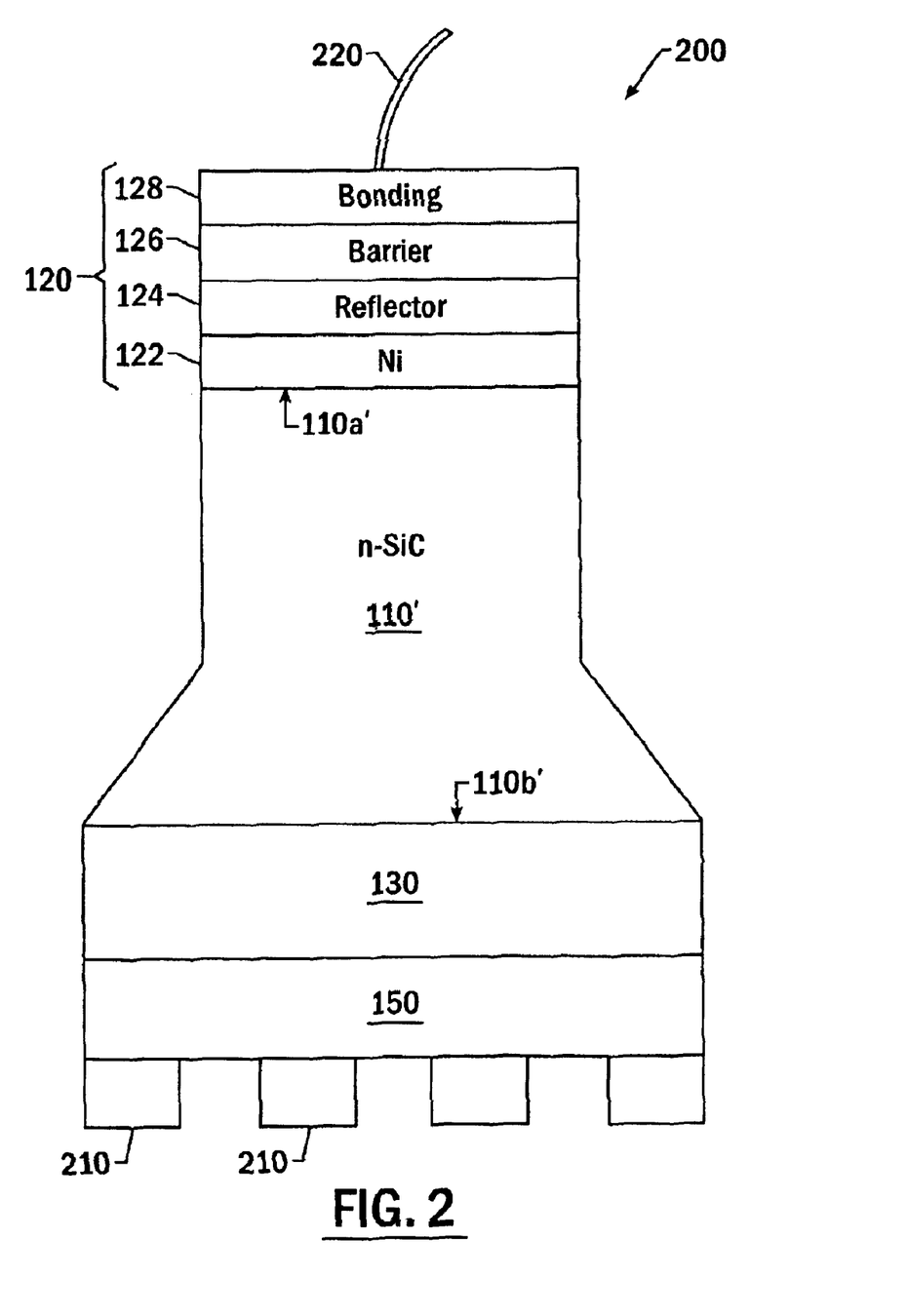
Figure 3:
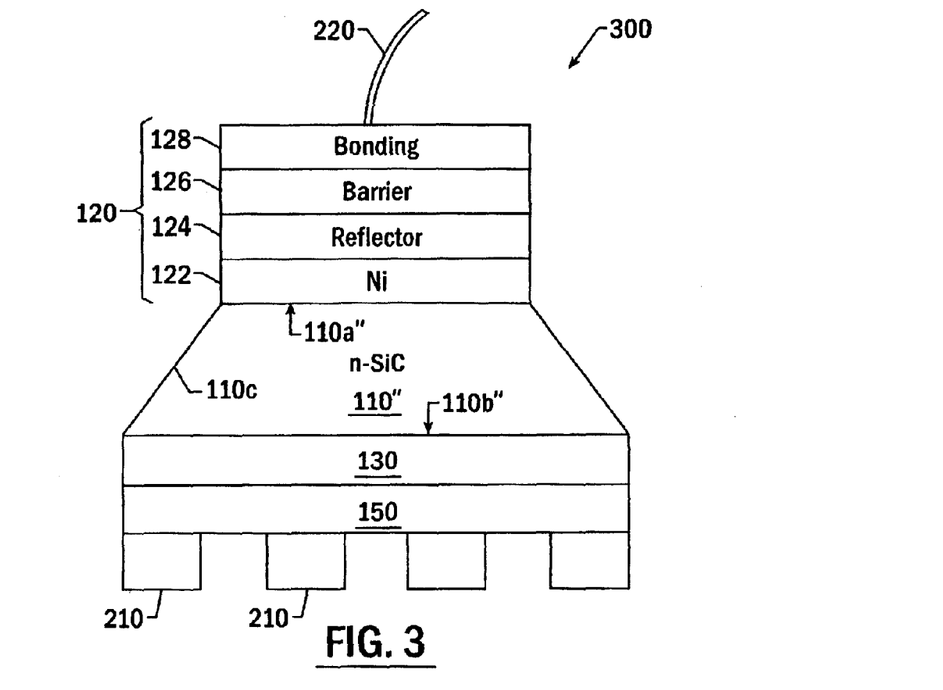

As also shown in FIG. 1, the reflective ohmic contact 120 also includes a conductive barrier layer 126, also referred to as a third layer, on the reflector layer 124 opposite the layer 122 consisting essentially of nickel. In some embodiments, the barrier layer is sufficiently thick to reduce or prevent migration of impurities from outside the barrier layer 126 into the reflector layer 124 and/or the ohmic layer 122 consisting essentially of nickel. In some embodiments, the barrier layer comprises platinum. In some embodiments of the invention, the barrier layer is at least about 250 Å thick. In other embodiments, the barrier layer is between about 250 Å and about 1 µm thick. In some embodiments of the invention, for example when the reflective ohmic contact 120 is attached to a submount 210 as shown in FIG. 1, the barrier layer is about 500 Å thick. In still other embodiments of the invention, for example when the reflective ohmic contact 120 is wire bonded as shown in FIGS. 2 and 3, the barrier layer 126 is about 1000 Å thick.

Finally, still referring to FIG. 1, reflective ohmic contacts according to embodiments of the invention include a conductive bonding layer 128, also referred to as a fourth layer, on the barrier layer 126 opposite the reflector layer 124. In some embodiments, the bonding layer 128 comprises gold. In some embodiments, the bonding layer 128 is at least about 250 Å thick. In other embodiments, the bonding layer 128 is between about 250 Å and about 1 µm thick. In some embodiments of the present invention, for example when the reflective ohmic contact 120 is attached to a submount 210 as shown in FIG. 1, the bonding layer 128 is about 500 Å thick. In still other embodiments, for example when the reflective ohmic contact 120 is wire bonded, as shown in FIGS. 2 and 3, the bonding layer is about 1 µm thick.

The bonding layer 128 may be bonded to a mounting support or submount 210, such as a heat sink. Silver epoxy may be used for bonding. When bonding the bonding layer 128 to a mounting support 210, relatively thin barrier layers 126 and bonding layer 128 may be used in some embodiments, as was described above. For example, a barrier layer 126 that is about 500 Å thick and a bonding layer 128 that is about 500 Å thick may be used. As also shown in FIG. 1, a wire 164 or other electrical connection may be provided between the cathode 160 and the ohmic contact 150 via a bonding region 162. LEDs 100 according to some embodiments of the invention may be packaged in conventional dome structures 180 that include an optical element such as a lens 182 for light emission. The entire dome structure 180 also may function as an optical element. The dome structure 180 may comprise plastic, glass and/or other materials, and also may include silicon gel, phosphor and/or other materials therein. Other LED structures that may be used with reflective ohmic contacts according to some embodiments of the present invention are described in the above-incorporated application Ser. No. 10/057,821.

Instead of discouraging or inhibiting light from entering the substrate, as may be done conventionally, some embodiments of the present invention can encourage light generated in the diode region 130 to enter the substrate 110, where it can be most efficiently extracted. Accordingly, some embodiments of the present invention may be particularly suited for use in a so-called "flip-chip" or "upside-down" packaging configuration as will now be described in connection with FIGS. 2 and 3. Embodiments of the invention also may be used with conventional "right-side-up" or "non-flip-chip" packaging, as was described in connection with FIG. 1.

Referring now to FIG. 2, LEDs 200 including reflective ohmic contacts 120, according to some embodiments of the present invention, include a substrate 110' and a diode region 130. As shown in FIG. 2, these LEDs 200 are provided in flip-chip configuration, wherein the substrate 110' is up (remote from the submount 210) and the diode region 130 is down (adjacent the submount 210). As also shown in FIG. 2, in some embodiments of the present invention, the substrate 110' may be configured such that the first face 110a' has a smaller surface area than the second face 110b'. However, in other embodiments, the surface areas may be identical or the second face 110b' may have smaller surface area than the first face 110a'. A wire 220 is bonded to the bonding layer 128 using conventional techniques. For wire bonding, thicker barrier layers 126 and/or bonding layers 128 may be used in some embodiments, as was described above. For example, the barrier layer 126 may be about 1000 Å thick and the bonding layer 128 may be about 1 µm thick. As also shown in FIG. 2, in some embodiments of the present invention, the layer 122 consisting essentially of nickel and/or the reflective ohmic contact 120 can cover the entire first face 110a' of the substrate 110'. Additional description of LEDs that have substrates with different area first and second faces may be found in the above-incorporated application Ser. No. 10/057,821.

FIG. 3 is a cross-sectional view of other LEDs, including reflective ohmic contacts 120 according to some embodiments of the invention. As shown in FIG. 3, these LEDs 300 include a silicon carbide substrate, such as an n-SiC substrate 110" including at least one sidewall having an oblique portion 110c adjacent the first face 110a". The oblique portion 110c forms a non-orthogonal angle, for example an obtuse angle such as an angle of 120°, with the first face 110a". In some embodiments, as shown in FIG. 3, the oblique portion 110c may extend from the first face 110a" all the way to the second face 110b". Embodiments of silicon carbide substrates having oblique portions 110c adjacent a first face 110a" are further described in Provisional Application Serial No. 60/411,980, entitled Phosphor-Coated Light Emitting Diodes Including Tapered Sidewalls, and Fabrication Methods Therefor, filed Sep. 19, 2002.

Figure 4:
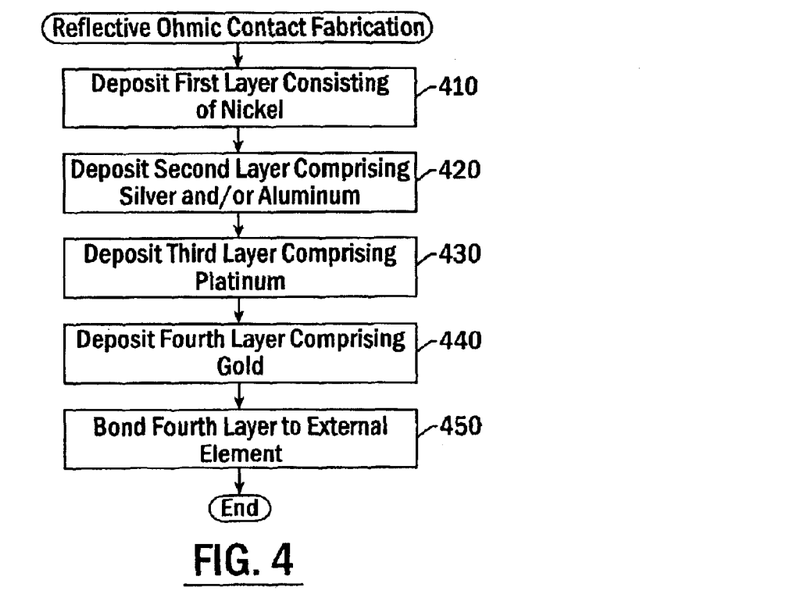
FIG. 4 is a flowchart of operations for fabricating LEDs and/or reflective ohmic contacts according to some embodiments of the present invention.

FIG. 4 is a flowchart illustrating methods of fabricating reflective ohmic contacts for silicon carbide, including for silicon carbide-based optoelectronic devices such as LEDs, according to some embodiments of the present invention. As shown in FIG. 4, at Block 410, a first layer consisting essentially of nickel, such as the layer 122 of FIGS. 1–3, is deposited, for example on a first face of a silicon carbide substrate, such as the substrate 110, 110' or 110" of FIGS. 1–3, respectively, that includes a diode region 130 on a second face thereof. As was already described, many techniques can be used to fabricate the substrate and the diode region.

Referring to now Block 420, a second layer comprising silver and/or aluminum, such as the reflector layer 124 of FIGS. 1–3, is deposited on the first layer opposite the first face. Referring to Block 430, a third layer comprising platinum, such as the barrier layer 126 of FIGS. 1–3, is deposited on the second layer opposite the first layer. At Block 440, a fourth layer comprising gold, such as the bonding layer 128 of FIGS. 1–3, is deposited on the fourth layer opposite the second layer. Finally, referring to Block 450, the fourth layer is bonded to an external element, such as a submount 210 of FIG. 1 or a wire 220 of FIGS. 2 and 3. All of the above-described depositing steps 410–440 may be performed using electron-beam deposition, thermal evaporation, sputter deposition and/or other conventional deposition techniques.

As shown in FIG. 4, according to some embodiments of the present invention, an anneal is not performed during Block 410, between Blocks 410 and 420, between Blocks 420 and 430, between Blocks 430 and 440, between Blocks 440 and 450 or during Block 450. Thus, in some embodiments of the present invention, reflective ohmic contacts are formed in an as-deposited condition without an anneal. An anneal may create undesirable oxides of the first layer consisting essentially of nickel and/or compromise the reflectivity of the reflector.

Moreover, as was shown in FIGS. 1–3, according to other embodiments of the present invention, the reflective ohmic contact 120 covers the entire first face 110a, 110a', 110a" of the silicon carbide substrate 110, 110', 110". Stated differently, patterning is not performed during Block 410, between Blocks 410 and 420, between Blocks 420 and 430, between Blocks 430 and 440, or between Blocks 440 and 450 of FIG. 4. In other embodiments, patterning may be performed during or between at least one of these blocks.

Finally, according to other embodiments of the invention, as shown in FIG. 4, the depositing of Blocks 410–440 may be performed using conventional electron-beam deposition, thermal evaporation, sputter deposition and/or other conventional deposition techniques, at room temperature. High temperature anneals need not be used.

Accordingly, reflective ohmic contacts to n-type silicon carbide and, in some embodiments, heavily doped n+ silicon carbide, have been described. These contacts may provide low electrical and optical loss at the reflective contact-silicon carbide interface. In some embodiments of the present invention, these contacts comprise respective layers of Ni/Ag/Pt/Au, with respective thicknesses of 25 Å/1000 Å/500 Å/500 Å. The layer 122 consisting essentially of nickel can be almost totally transparent to the incident light, because it is so thin. It has been found, according to some embodiments of the present invention, that other metals, such as titanium or chromium may be much more optically absorbing than nickel or platinum, even in layers as thin as 25 Å. Moreover, it has been found that nickel can be superior to platinum as an ohmic metal. See, for example, U.S. patent application Ser. No. 10/003,331, filed Oct. 31, 2001, entitled Low Temperature Formation of Backside Ohmic Contacts for Vertical Device to Slater et al., the disclosure of which is hereby incorporated by reference herein in its entirety as if set forth fully herein. Accordingly, embodiments of the present invention provide an ohmic layer 122 consisting essentially of nickel.

Second embodiments of the invention also use a reflector layer 124 comprising silver. Silver can be an excellent reflector. Moreover, the barrier layer 126 and bonding layer 128 are chemically stable layers that can protect the nickel and the silver mirror from chemical attack and/or oxidation. The resulting reflective ohmic contacts 120 according to embodiments of the present invention can have low optical absorption and low electrical loss.

Conventional silicon carbide contacts of annealed or sintered nickel that include substantial amounts of nickel oxides, or of as-deposited ohmics such as Ti/Pt/Au, may be electrically and/or optically lossy. Since these traditional contacts may be lossy, the amount of coverage on the silicon carbide substrate surface may be limited conventionally, to avoid absorption and attenuation of the incident and reflected light. More specifically, in a light emitting diode, a conventional contact to the n-type silicon carbide substrate may be a grid that may cover only about 20% of the silicon carbide substrate surface. This grid may be formed using a photolithography process step, whereby the ohmic metal can be patterned as a grid by selectively depositing or adding the metal to the silicon carbide surface, or by selectively etching or subtracting deposited metal from the silicon carbide surface. The conventional grid contact allows the silver epoxy used for the die attach to act as a reflector on the silicon carbide between the grid lines of the ohmic metal.

In sharp contrast, reflective ohmic contacts according to some embodiments of the present invention can provide greater contact area and in some embodiments, can cover the entire substrate face, which can improve the electrical resistance of the metal-silicon carbide interface, while providing the reflective nature of silver epoxy. The larger contact area can also reduce the need for lower specific contact resistance between the silicon carbide and the ohmic metal. Moreover, the ability to place the metal fully over the silicon carbide surface, according to some embodiments of the present invention, without the need to provide photolithography, can provide a reduction in labor, handling and potential wafer breakage, cycle time, outgoing inspection activity and/or cost, as compared to a conventional grid contact approach that is used to fabricate silicon carbide-based LED wafers and chips.

It also will be understood that the thickness of the barrier and bonding layers may be varied, depending upon the external element that is bonded to the bonding layer. For example, in embodiments of the present invention that are shown in FIGS. 2 and 3, the bond pad is also the ohmic contact to the silicon carbide substrate. These embodiments of the present invention may employ a barrier layer 126 comprising platinum having a thickness of about 1000 Å, and a bonding layer 128 comprising gold having a thickness of about 1 $\mu$m. A low loss reflective substrate contact-bond pad combination thereby may be formed.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A reflective ohmic contact for silicon carbide comprising:
    a layer consisting essentially of nickel on the silicon carbide, which is configured to provide an ohmic contact to the silicon carbide and to allow transmission therethrough of optical radiation that emerges from the silicon carbide;
    a reflector layer on the layer consisting essentially of nickel opposite the silicon carbide;
    a barrier layer on the reflector layer opposite the layer consisting essentially of nickel; and
    a bonding layer on the barrier layer opposite the reflector layer.

2. A reflective ohmic contact according to claim 1 wherein the layer consisting essentially of nickel is sufficiently thick to provide an ohmic contact to the silicon carbide, but is sufficiently thin to allow transmission therethrough of optical radiation that emerges from the silicon carbide.

3. A reflective ohmic contact according to claim 2 wherein the layer consisting essentially of nickel is sufficiently thin to allow transmission therethrough of substantially all optical radiation that emerges from the silicon carbide.

4. A reflective ohmic contact according to claim 2 wherein the reflector layer is sufficiently thick to reflect substantially all optical radiation that emerges from the layer consisting essentially of nickel.

5. A reflective ohmic contact according to claim 1 wherein the silicon carbide includes a surface and wherein the layer consisting essentially of nickel covers the surface.

6. A reflective ohmic contact according to claim 1 wherein the silicon carbide is n-type silicon carbide.

7. A reflective ohmic contact according to claim 1 in combination with a diode region on the silicon carbide.

8. A reflective ohmic contact according to claim 1 wherein the layer consisting essentially of nickel is a layer consisting of unannealed nickel.

9. A reflective ohmic contact according to claim 7 in further combination with a mounting assembly on the bonding layer opposite the barrier layer.

10. A reflective ohmic contact according to claim 1 wherein the layer consisting essentially of nickel is between about 15 Å and about 100 Å thick.

11. A reflective ohmic contact according to claim 1 wherein the layer consisting essentially of nickel is between about 15 Å and about 25 Å thick.

12. A reflective ohmic contact according to claim 1 wherein the reflector layer comprises silver and/or aluminum.

13. A reflective ohmic contact according to claim 1 wherein the barrier layer comprises platinum.

14. A reflective ohmic contact according to claim 1 wherein the bonding layer comprises gold.

15. A contact for silicon carbide comprising:
a first layer consisting essentially of nickel on the silicon carbide;
a second layer comprising silver and/or aluminum on the first layer opposite the silicon carbide;
a third layer comprising platinum on the second layer opposite the first layer; and
a fourth layer comprising gold on the third layer opposite the second layer.

16. A contact according to claim 15 wherein the silicon carbide includes a surface and wherein the first layer covers the surface.

17. A contact according to claim 15 wherein the silicon carbide is n-type silicon carbide.

18. A contact according to claim 15 in combination with a diode region on the silicon carbide.

19. A contact according to claim 15 wherein the first layer consists of unannealed nickel.

20. A contact according to claim 18 in further combination with a mounting assembly on the fourth layer opposite the third layer.

21. A contact according to claim 15 wherein the first layer is between about 15 Å and about 100 Å thick.

22. A contact according to claim 15 wherein the second layer is at least about 700 Å thick.

23. A contact according to claim 15 wherein the third layer is at least about 250 Å thick.

24. A contact according to claim 15 wherein the fourth layer is at least about 250 Å thick.

25. A light emitting device comprising:
a silicon carbide substrate having first and second opposing faces;
a light emitting region on the second face;
an ohmic contact on the diode region opposite the second face;
a layer consisting essentially of nickel on the first face, which is configured to provide an ohmic contact to the first face and to allow transmission therethrough of optical radiation that emerges from the first face;
a reflector layer on the layer consisting essentially of nickel opposite the first face;
a barrier layer on the reflector layer opposite the layer consisting essentially of nickel; and
a bonding layer on the barrier layer opposite the reflector layer.

26. A device according to claim 25 wherein the layer consisting essentially of nickel is sufficiently thick to provide an ohmic contact to the silicon carbide, but is sufficiently thin to allow transmission therethrough of optical radiation that emerges from the silicon carbide.

27. A device according to claim 26 wherein the layer consisting essentially of nickel is sufficiently thin to allow transmission therethrough of substantially all optical radiation that emerges from the first face.

28. A device according to claim 26 wherein the reflector layer is sufficiently thick to reflect substantially all optical radiation that emerges from the layer consisting essentially of nickel.

29. A device according to claim 25 wherein the layer consisting essentially of nickel covers the first face.

30. A device according to claim 25 wherein the layer consisting essentially of nickel is a layer consisting of unannealed nickel.

31. A device according to claim 25 in further combination with a mounting assembly on the bonding layer opposite the barrier layer.

32. A device according to claim 25 wherein the layer consisting essentially of nickel is between about 15 Å and about 100 Å thick.

33. A device according to claim 25 wherein the reflector layer comprises silver and/or aluminum.

34. A device according to claim 25 wherein the barrier layer comprises platinum.

35. A device according to claim 25 wherein the bonding layer comprises gold.

36. A light emitting device comprising:
a silicon carbide substrate having first and second opposing faces;
a light emitting region on the second face;
an ohmic contact on the light emitting region opposite the second face;
a first layer consisting essentially of nickel on the first face;
a second layer comprising silver and/or aluminum on the first layer opposite the first face;
a third layer comprising platinum on the second layer opposite the first layer; and
a fourth layer comprising gold on the third layer opposite the second layer.

37. A device according to claim 36 wherein the first layer covers the first face.

38. A device according to claim 36 wherein the first layer consists of unannealed nickel.

39. A device according to claim 36 in further combination with a mounting assembly on the fourth layer opposite the third layer.

40. A device according to claim 36 wherein the first layer is between about 15 Å and about 100 Å thick.

41. A device according to claim 36 wherein the second layer is at least about 700 Å thick.

42. A device according to claim 36 wherein the third layer is at least about 250 Å thick.

43. A device according to claim 36 wherein the fourth layer is at least about 250 Å thick.

44. A method of fabricating a light emitting device comprising:
depositing a first layer consisting essentially of nickel on a first face of a silicon carbide substrate that includes a light emitting region on a second face thereof;
depositing a second layer comprising silver and/or aluminum on the first layer opposite the first face;
depositing a third layer comprising platinum on the second layer opposite the first layer;
depositing a fourth layer comprising gold on the third layer opposite the second layer; and bonding the fourth layer to an external element, wherein annealing is not performed during the depositing a first layer, between the depositing a first layer and the depositing a second layer, between the depositing a second layer and the depositing a third layer, between the depositing a third layer and the depositing a fourth layer, between the depositing a fourth layer and the bonding the fourth layer, and during the bonding the fourth layer.

45. A method according to claim 44 wherein patterning also is not performed during the depositing a first layer, between the depositing a first layer and the depositing a second layer, between the depositing a second layer and the depositing a third layer, between the depositing a third layer and the depositing a fourth layer and between the depositing a fourth layer and the bonding the fourth layer.

46. A method according to claim 44 wherein the depositing a first layer, the depositing a second layer, the depositing a third layer and the depositing a fourth layer all are performed at room temperature.

* * * * *

UNITED STATES PATENT AND TRADEMARK OFFICE
CERTIFICATE OF CORRECTION

PATENT NO. : 6,794,684 B2
DATED : September 21, 2004
INVENTOR(S) : Slater, Jr. et al.

It is certified that error appears in the above-identified patent and that said Letters Patent is hereby corrected as shown below:

<u>Title page,</u>
Item [56], References Cited, U.S. PATENT DOCUMENTS, should include:
-- 6,534,797        * 3/2003    Edmond et al.   257/97
   2003/0168664 A1  * 9/2003    Hahn et al.     257/79 --

Signed and Sealed this

Nineteenth Day of July, 2005

JON W. DUDAS
*Director of the United States Patent and Trademark Office*